(12) United States Patent
Cox

(10) Patent No.: US 7,005,381 B1
(45) Date of Patent: Feb. 28, 2006

(54) METHOD FOR FLAT ELECTRODES

(75) Inventor: Isaiah Watas Cox, London (GB)

(73) Assignee: Borealis Technical Limited, (GI)

( * ) Notice: Subject to any disclaimer, the term of this patent is extended or adjusted under 35 U.S.C. 154(b) by 134 days.

(21) Appl. No.: 10/639,055

(22) Filed: Aug. 11, 2003

Related U.S. Application Data

(60) Provisional application No. 60/403,092, filed on Aug. 12, 2002.

(51) Int. Cl.
*H01L 21/302* (2006.01)

(52) U.S. Cl. .................................................. 438/689

(58) Field of Classification Search ................. 438/689
See application file for complete search history.

(56) References Cited

U.S. PATENT DOCUMENTS

| | | |
|---|---|---|
| 6,204,151 B1 * | 3/2001 | Malik et al. ................ 438/460 |
| 6,417,060 B1 | 7/2002 | Tavkhelidze et al. |
| 2003/0035261 A1 * | 2/2003 | Bensaoula et al. ....... 361/306.3 |

* cited by examiner

*Primary Examiner*—David S. Blum

(57) ABSTRACT

The present invention is a method for reducing nanoscale surface roughness. The method involves exposing the surface to an environment that preferentially promotes evaporation of material from the region of nanoscale roughness. The methods involve either heating the surface, or flushing an inert gas across the surface, or a combination of both.

11 Claims, 3 Drawing Sheets

METHOD FOR FLAT ELECTRODES

CROSS-REFERENCE TO RELATED APPLICATIONS

This application claims the benefit of U.S. Provisional Application No. 60/403,092, filed 12 Aug. 2002.

BACKGROUND OF THE INVENTION

For tunneling diode devices, the separation of the electrodes is necessarily very small (<1–10 nm) so that electrons may tunnel from an emitter electrode to a collector electrode. Performance of such a device is very dependent on creating and maintaining a gap having such small dimensions.

In U.S. Pat. No. 6,417,060 Tavkhelidze et al. disclose a method for manufacturing a pair of electrodes in which topological features in one electrode are matched in the other. The method involves fabricating a first electrode with a substantially flat surface and placing a sacrificial layer over it. A further material is placed over the sacrificial layer. The sacrificial layer is removed with an etchant. Alternatively, the sacrificial layer is removed by cooling the sandwich with liquid nitrogen, or alternatively still, the sacrificial layer is removed by heating the sacrificial layer, thereby evaporating the sacrificial layer. Electrodes so formed may be placed in close proximity, 5 nm or less.

Using such a pair of electrodes in a tunneling diode device may be limited by nanoscale roughness; peaks, ridges, etc in one electrode that have dimensions sufficiently great that they contact the other electrode and prevent flatter regions from coming into sufficiently close proximity to allow tunneling.

There remains a need therefore for reducing nanoscale roughness on electrode surfaces.

BRIEF SUMMARY OF THE INVENTION

The present invention is a method for reducing nanoscale roughness on a surface. The method comprises exposing a surface to be treated to an environment that promotes preferential evaporation from the regions of the surface having nanoscale roughness.

In one embodiment, the environment is achieved by heating the surface to be treated.

In a second embodiment, the environment is achieved by passing a stream of passive gas over the surface to be treated.

In a further embodiment, the environment is achieved by evacuating the region in the vicinity of the electrodes.

In a yet further embodiment, the environment is achieved by a combination of the other embodiments.

BRIEF DESCRIPTION OF THE SEVERAL VIEWS OF THE DRAWING

For a more complete understanding of the present invention and the technical advantages thereof, reference is now made to the following description taken in conjunction with the accompanying drawings, in which.

DETAILED DESCRIPTION OF THE INVENTION

The embodiments of the present invention and its technical advantages are best understood by referring to FIGS. 1–5.

Figure 1:
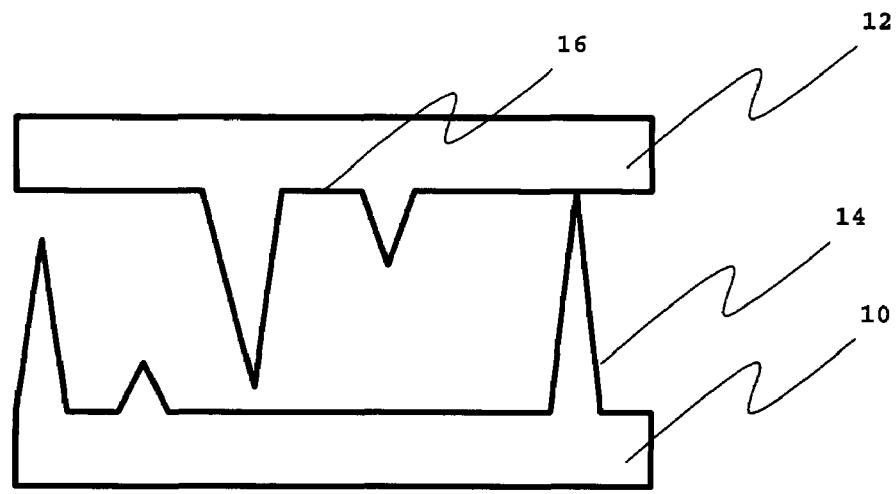
FIG. 1 is a diagrammatic representation of a pair of electrodes having nanoscale roughness.
Figure 2:
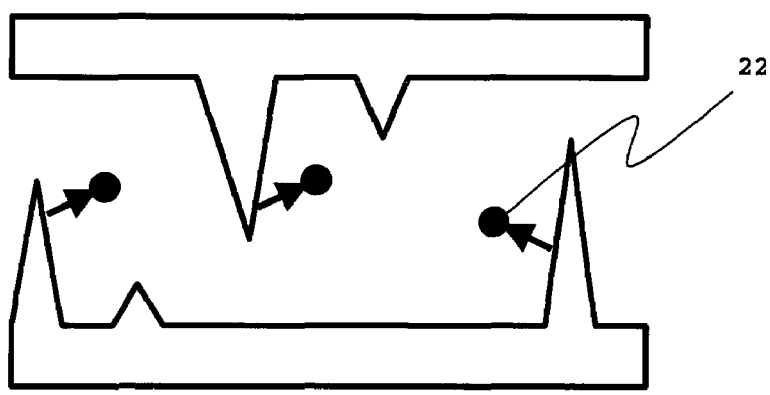
FIG. 2 is a diagrammatic representation of evaporation of atoms from the nanoscale peak areas of an electrode pair.

The present invention is a method for reducing nanoscale surface roughness from the surface of an electrode. FIG. 1 shows a greatly enlarged schematic of nanoscale roughness on the surface of electrodes 100 and 102, and shows how peak areas 104 prevent flat areas 106 from coming into close proximity.

The method of the present invention comprises the placing of a surface having nanoscale roughness, such as an electrode or an electrode pair, in an environment where evaporation from the peak areas 104 is enhanced in comparison to evaporation from flat areas 106. This process may be better understood by referring to FIG. 2, where atoms 108 are shown leaving the peak areas 104. This loss of material results in the depletion of the peak areas, and a reduction in nanoscale roughness, as shown in FIG. 3.

Figure 3:
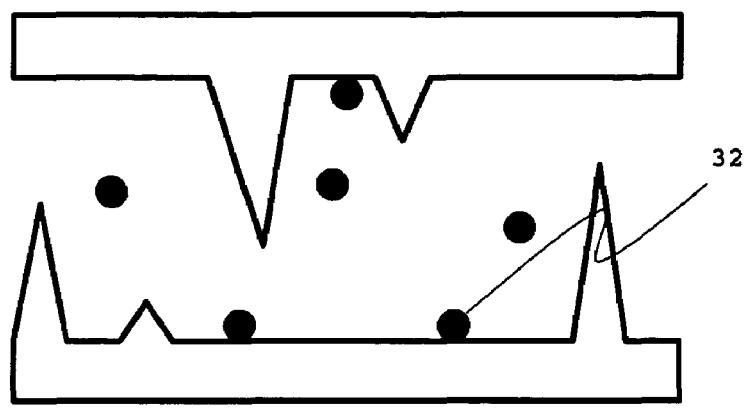
FIG. 3 is a diagrammatic representation of depletion of the nanoscale peak areas and condensation of some atoms back onto the electrode surfaces.

FIG. 3 also shows what happens to the atoms, 110, which condense back on the electrode surfaces. These form subnanoscale perturbations on the flat surfaces.

Figure 4:
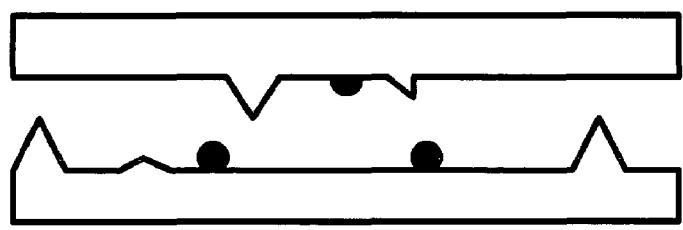
FIG. 4 is a diagrammatic representation of the reduction in nanoscale roughness.

The benefit of the method of the present invention is that the treated surface or surfaces have a reduced nanoscale roughness. In one application of the process, it allows the flat surfaces to come into sufficiently close proximity to allow tunnelling to occur; this is shown in FIG. 4.

As indicated above, the method of the present invention comprises the placing of a surface having nanoscale roughness, in an environment where evaporation from the peak areas is enhanced in comparison to evaporation from flat areas. Evaporation from surfaces, particularly metal surfaces, has been well studied, and is known to increase with temperature. It is also believed that on a surface having the nanoscale surface roughness shown in FIG. 1, local temperatures in the region of the peak regions are considerably higher than bulk temperatures. These factors are harnessed in the present invention by raising the temperature of the surface to be treated, so that evaporation from the peak areas is greater than from the flat areas. Thus the 'smoothing' process shown in FIGS. 1–4 will be enhanced as the temperature is raised. The peaks and tips will get hotter, and evaporate into the gap, which will therefore contribute to a reduction in nanoscale surface roughness.

In some instances, thermal tensions introduced by heating the electrode pair in this way may be problematical. For example, if the electrodes are held in the correct position and orientation by piezo-electric or similar devices, the elevated temperatures may cause the piezo-electric or similar devices to fail. In one embodiment, therefore, a lower temperature is utilized, and the smoothing process may take from several hours up to several weeks.

Another factor that will affect evaporation is the vapor pressure exerted by the atoms that have evaporated from the surface to be treated. These may or may not re-attach to the electrodes, as shown in the Figures. In another aspect of the present invention, an environment for promoting evaporation from the peak areas is achieved by exposing the surface to a vacuum; alternatively, an environment for promoting evaporation from the peak areas is achieved by reducing the vapor pressure exerted by surface atoms by means of a constant flush of passive gas over the surface to be treated. This not only enhances evaporation, but, for the constant flush method, also promotes preferential evaporation from the peak areas, as these have a greater surface area in contact with the passive gas. Further, the environment may comprise an intermittent flush combined with exposure to vacuum.

The following example describes one specific approach for physically achieving the method of the invention; it is to be understood that this description is not intended to be construed in a limiting sense.

Figure 5:
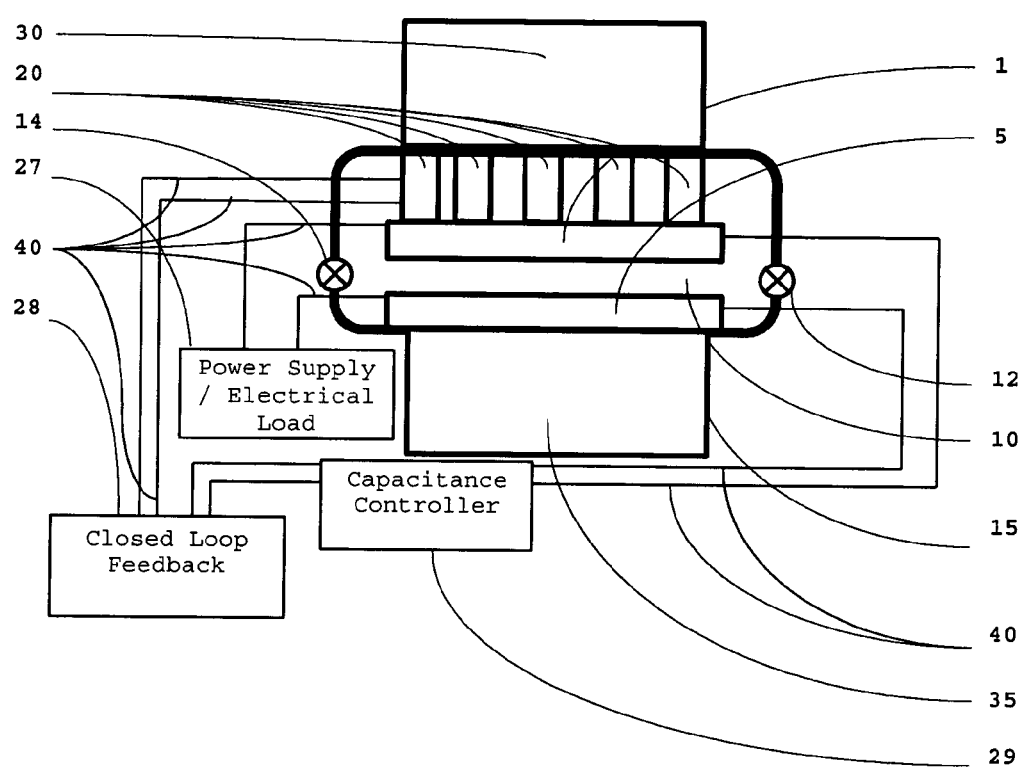
FIG. 5 is a diagrammatic representation of one embodiment of the electrode configuration of the present invention.

Referring now to FIG. 5, two electrodes 1 and 5 are separated by a region 10 and housed in a housing 15. Electrode 1 is attached to a number of piezo-electric actuators 20 at intervals. An electric field is applied to the piezo-electric actuators via connecting wires 40 which causes the actuators to expand or contract longitudinally, thereby altering the longitudinal distance of region 10 between electrodes 1 and 5. Electrodes 1 and 5 are connected to capacitance controller 29. Applying an electric field to piezo-electric actuators 20 controls the longitudinal distance of region 10 between electrodes 1 and 5. The capacitance between emitter 5 and collector 1 is measured and controlling circuitry 29 adjusts the field applied to piezo-electric actuators 20 to hold the capacitance, and consequently the region 10 between the electrodes, at a predetermined fixed value. Alternatively the controller may be set to maximize the capacitance and thereby minimize region 10 between the electrodes.

Electrodes 1 and 5 have nanoscale roughness that prevents them from being brought into sufficiently close contact to allow tunnelling. In one embodiment, the electrodes are moved apart, the housing is evacuated, and heat is applied to the assembly shown in FIG. 5 via thermal interfaces 30 and 35.

In another embodiment, the housing is slowly purged with a passive gas at low pressure via valves 12 and 14. The passive gas may be argon.

In a further embodiment, the combination of heating and purging is utilized.

In a yet further embodiment, the combination of exposure to vacuum and purging is utilized.

In another further embodiment, the environment comprises the operating conditions for the device, whereby a voltage bias is applied between the electrodes and/or a temperature differential is applied between them, thus operating the device as a gap diode. The gap diode may be, for example, a thermo-tunneling gap diode, a thermionic gap diode or a gap diode heat pump. This 'burn-in' process involves operating the device, either with a fixed diode spacing, or with a variable one (whilst the latter is preferable, the former is cheaper).

Various modifications and combinations of the illustrative embodiments will be apparent to persons skilled in the art upon reference to this description. It is to be further understood, therefore, that numerous changes in the details of the embodiments of the present invention and additional embodiments of the present invention will be apparent to, and may be made by, persons of ordinary skill in the art having reference to this description. It is contemplated that all such changes and additional embodiments are within the spirit and true scope of the invention.

What is claimed is:

1. A method for reducing nanoscale roughness on a pair of surfaces, comprising the step of exposing the surfaces to an environment for promoting evaporation of component molecules or atoms from one or more angular features of said surfaces, wherein said step of exposing the surfaces to an environment for promoting evaporation comprises applying a voltage bias between said surfaces, whereby said nanoscale roughness is reduced.

2. The method of claim 1 wherein said step of exposing the surfaces to an environment for promoting evaporation additionally comprises heating said surfaces.

3. The method of claim 1 wherein said step of exposing the surfaces to an environment for promoting evaporation additionally comprises reducing a vapor pressure exerted by said molecules or atoms in said environment.

4. The method of claim 3 wherein said step of reducing a vapor pressure comprises evacuating said environment.

5. The method of claim 3 wherein said step of reducing a vapor pressure comprises purging said environment with an inert gas.

6. The method of claim 3 wherein said step of reducing a vapor pressure comprises the combination of an evacuating step and a purging step.

7. The method of claim 1 wherein said step of exposing the surfaces to an environment for promoting evaporation additionally comprises the combination of heating said surfaces and reducing a vapor pressure exerted by said molecules or atoms in said environment.

8. The method of claim 7 wherein said step of reducing a vapor pressure comprises evacuating said environment.

9. The method of claim 7 wherein said step of reducing a vapor pressure comprises purging said environment with an inert gas.

10. The method of claim 7 wherein said step of reducing a vapor pressure comprises the combination of an evacuating step and a purging step.

11. The method of claim 1 wherein said step of exposing the surfaces to an environment for promoting evaporation additionally comprises applying a temperature differential between said surfaces.

* * * * *